(12) United States Patent
Seo et al.

(10) Patent No.: US 10,444,613 B2
(45) Date of Patent: Oct. 15, 2019

(54) DISPLAY DEVICE

(71) Applicant: Samsung Display Co., Ltd., Yongin-si, Gyeonggi-do (KR)

(72) Inventors: Tae An Seo, Hwaseong-si (KR); Jin Hwan Choi, Seoul (KR); Jung Hun Lee, Hwaseong-si (KR)

(73) Assignee: Samsung Display Co., Ltd. (KR)

( * ) Notice: Subject to any disclaimer, the term of this patent is extended or adjusted under 35 U.S.C. 154(b) by 74 days.

(21) Appl. No.: 15/582,069

(22) Filed: Apr. 28, 2017

(65) Prior Publication Data
US 2017/0325343 A1  Nov. 9, 2017

(30) Foreign Application Priority Data

May 4, 2016 (KR) .................. 10-2016-0055473

(51) Int. Cl.
| | |
|---|---|
| G03B 21/58 | (2014.01) |
| H01L 51/00 | (2006.01) |
| H05K 5/00 | (2006.01) |
| H05K 5/03 | (2006.01) |
| G06F 1/16 | (2006.01) |
| H01L 51/52 | (2006.01) |

(52) U.S. Cl.
CPC .......... *G03B 21/58* (2013.01); *G06F 1/1652* (2013.01); *H01L 51/0097* (2013.01); *H05K 5/0017* (2013.01); *H05K 5/03* (2013.01); *H01L 51/5237* (2013.01); *H01L 2251/5338* (2013.01)

(58) Field of Classification Search
CPC ..................................................... G03B 21/58
USPC ......................................................... 359/461
See application file for complete search history.

(56) References Cited

U.S. PATENT DOCUMENTS

| | | | | |
|---|---|---|---|---|
| 4,406,519 | A * | 9/1983 | Shaw | G03B 21/58 160/328 |
| 7,782,531 | B2 * | 8/2010 | Zhu | G03B 21/56 359/461 |
| 8,120,846 | B2 * | 2/2012 | Trelohan | G03B 21/58 359/461 |
| 9,098,241 | B1 | 8/2015 | Cho et al. | |
| 2010/0053747 | A1 * | 3/2010 | Maruyama | G03B 21/58 359/443 |
| 2017/0044826 | A1 * | 2/2017 | Nakae | E06B 9/42 |
| 2017/0131625 | A1 * | 5/2017 | Jo | F16M 11/22 |
| 2018/0031961 | A1 * | 2/2018 | Kasahara | G03B 21/58 |

FOREIGN PATENT DOCUMENTS

| | | |
|---|---|---|
| JP | 10-198295 A | 7/1998 |
| JP | 4670424 B2 | 1/2011 |
| KR | 20-2010-0000264 U | 1/2010 |
| KR | 10-1570869 B1 | 11/2015 |

* cited by examiner

*Primary Examiner* — Christopher E Mahoney
(74) *Attorney, Agent, or Firm* — Innovation Counsel LLP

(57) ABSTRACT

A display device includes a flexible display panel, a roller for winding the flexible display panel, an elastic holder fixed to an edge of the flexible display panel and having a side parallel to the edge of the flexible display panel, and a tension applier set disposed at opposite ends of the elastic holder for tensioning the elastic holder.

20 Claims, 9 Drawing Sheets

DISPLAY DEVICE

RELATED APPLICATION(S)

This application claims priority to and the benefit of Korean Patent Application No. 10-2016-0055473 filed in the Korean Intellectual Property Office on May 4, 2016; the entire contents of the Korean Patent Application are incorporated herein by reference.

BACKGROUND

1. Field

This technical field relates to a display device including a flexible display panel.

2. Description of the Related Art

In a display device, a flexible display panel may be wound on a roller when not in use and may be unfolded from the roller for displaying images. Wrinkles may occur on the flexible display panel due to various causes. The wrinkles may lead to undesirable image distortion and/or damage of the flexible display panel.

The above information disclosed in this Background section is for enhancement of understanding of the background of this application. The Background section may contain information that does not form the prior art that is already known in this country to a person of ordinary skill in the art.

SUMMARY

An embodiment provides a display device including: a flexible display panel; a roller configured to wind the flexible display panel thereon; an elastic holder fixed to an edge of the flexible display panel, to have a long side that is parallel to the edge; and a tension applier set disposed at opposite end portions of the elastic holder to tension the elastic holder.

A length of the long side of the elastic holder may be equal to or greater than that of the edge of the flexible display panel, and the elastic holder may have a groove portion into which the edge of the flexible display panel is fit. The display device may further include a fixing frame configured to surround the elastic holder, and the fixing frame may have a cover surface and a side wall connected with an edge of the cover surface.

The tension applier set may include: a pair of nuts fixed to opposite end portions of the elastic holder; and a pair of bolts fastened to the pair of nuts, interposing the side wall of the fixing frame. The display device may further include a connector configured to partially fix the elastic holder to the cover surface.

The display device may further include a plurality of dampers disposed between the elastic holder and the cover surface of the fixing frame. The dampers may have elasticity that is greater than that of the elastic holder. The dampers may be extended in a direction of pulling the flexible display panel when the flexible display panel is wound on the roller.

The tension applier may be configured to slide to the fixing frame in the direction of pulling the flexible display panel. The tension applier may include: a pair of nuts fixed to opposite end portions of the elastic holder; and a pair of bolts respectively fastened to the pair of nuts, interposing the side wall of the fixing frame, and a pair of slits may be formed in the side wall for sliding of each of the pair of bolts.

The display device may further include: an optical sensor mounted in a housing that surrounds the roller, to sense biased rolling and wrinkles of the flexible display panel by photographing the flexible display panel; and a roller moving unit coupled to the roller to move the roller in an axial direction.

The roller moving unit may compensate a bias of the flexible display panel generated in a direction while the flexible display panel is wound to the roller, by moving the roller in the direction.

The roller moving unit may include: a roller supporting unit coupled to a lower portion of the roller to support the roller; and a moving motor coupled to the roller supporting unit through a power transmission unit to move the roller supporting unit. The power transmission unit may include: a rotary screw fixed to the moving motor; and a nut block fixed to the roller supporting unit and screw-coupled to the rotary screw.

An embodiment may be related to a display device. The display device may include the following elements: a flexible display panel; a roller for winding the flexible display panel; an elastic holder fixed to an edge of the flexible display panel, wherein a side of the elastic holder may be parallel to the edge of the flexible display panel; and a first tension applier and a second tension applier disposed at a first end of the elastic holder and a second end of the elastic holder, respectively, for tensioning the elastic holder.

The side of the elastic holder may be positioned between the first end of the elastic holder and the second end of the elastic holder and may be as long as or longer than the edge of the flexible display panel. The elastic holder may have a groove. The edge of the flexible display panel may be secured in the groove.

The display device may include a frame. The frame may at least partially surround the elastic holder. The frame may include a cover and a first side wall. The first side wall may be directly connected to the cover and may be oriented at a right angle, an acute angle, or an obtuse angle with respect to the cover.

The first tension applier may include the following elements: a first nut fixed to the first end of the elastic holder; and a first bolt extending through the first side wall and partially positioned inside the first nut.

The display device may include a connector shorter than the side of the elastic holder, positioned between the elastic holder and the cover, and fixing the elastic holder to the cover.

The display device may include a plurality of elastic dampers disposed between the elastic holder and the cover and connected to each of the elastic holder and the cover. Elasticity of the elastic dampers may be greater than elasticity of the elastic holder.

The elastic dampers may extend toward the flexible display panel when the flexible display panel is wound on the roller.

The first tension applier may slide further away from the cover when the flexible display panel is wound on the roller.

The first side wall may have a first slit. The first tension applier may include the following elements: a first nut fixed to the first end of the elastic holder; and a first bolt extending through the first slit and fastened to the first nut. The first bold may slide along the first slit.

The display device may include the following elements: a housing at least partially surrounding the roller; an optical sensor mounted in the housing for sensing at least one of biased rolling and wrinkles of the flexible display panel by photographing the flexible display panel; and a roller moving unit coupled to the roller for moving the roller in a direction parallel to an axis of the roller.

The roller moving unit may be longer than the roller in the direction.

The roller moving unit may include the following elements: a roller supporting unit coupled to the roller; a power transmission unit; and a moving motor coupled to the roller supporting unit through the power transmission unit to provide power for moving the roller supporting unit.

The power transmission unit may include the following elements: a rotary screw fixed to the moving motor; and a nut block fixed to the roller supporting unit and screw-coupled to the rotary screw.

The first tension applier may include the following elements: a first nut secured to the first end of the elastic holder; and a first bolt partially positioned inside the first nut.

The first nut may be as wide as the first end of the elastic holder in a direction perpendicular to the side of the elastic holder.

The second tension applier may include the following elements: a second nut secured to the second end of the elastic holder; and a second bolt partially positioned inside the second nut and aligned with the first bolt.

The display device may include a frame. The frame may include two side walls opposite each other. The elastic holder may be positioned between the two side walls. The first bolt may include a first bolt head. The second bolt may include a second bolt head. The two side walls may be positioned between the first bolt head and the second bolt head.

The display device may include the following elements: a damper, wherein elasticity of the damper may be greater than elasticity of the elastic holder, and wherein the elastic holder may be positioned between the damper and the flexible display panel; and a frame connected through the damper to the elastic holder.

The frame may include the following elements: a cover, wherein the damper may be positioned between the cover and the elastic holder; and a wall directly connected to the cover and directly contacting the elastic holder. The wall may guide sliding movement of the elastic holder when the damper stretches toward the flexible display panel.

According to embodiments, a display device can provide images with satisfactory display quality by making the associated flexible display panel substantially flat. According to embodiments, a display device can prevent generation of wrinkles when the associated display panel is wound. In embodiments, a display device can have satisfactory reliability by preventing or minimizing damage of the associated display panel potentially caused by wrinkles.

DETAILED DESCRIPTION

Example embodiments are described with reference to the accompanying drawings. As those skilled in the art would realize, the described embodiments may be modified in various ways.

Although the terms "first", "second", etc. may be used herein to describe various elements, these elements, should not be limited by these terms. These terms may be used to distinguish one element from another element. Thus, a first element discussed below may be termed a second element without departing from teachings of one or more embodiments. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

It will be understood that when a first element (such as a layer, film, region, or substrate) is referred to as being "on" a second element, the first element can be directly on the second element, or one or more intervening elements may be present between the first element and the second element. When a first element is referred to as being "directly on" a second element, there are no intended intervening elements (except environmental elements such as air) present between the first element and the second element. Further, in the specification, the word "on" or "over" means positioning on or below an object and does not necessarily mean positioning on the upper side of the object based on a gravity direction.

In the specification, unless explicitly described to the contrary, the word "comprise" and variations such as "comprises" or "comprising" may imply the possibility of further inclusion of one or more other elements.

Figure 1:
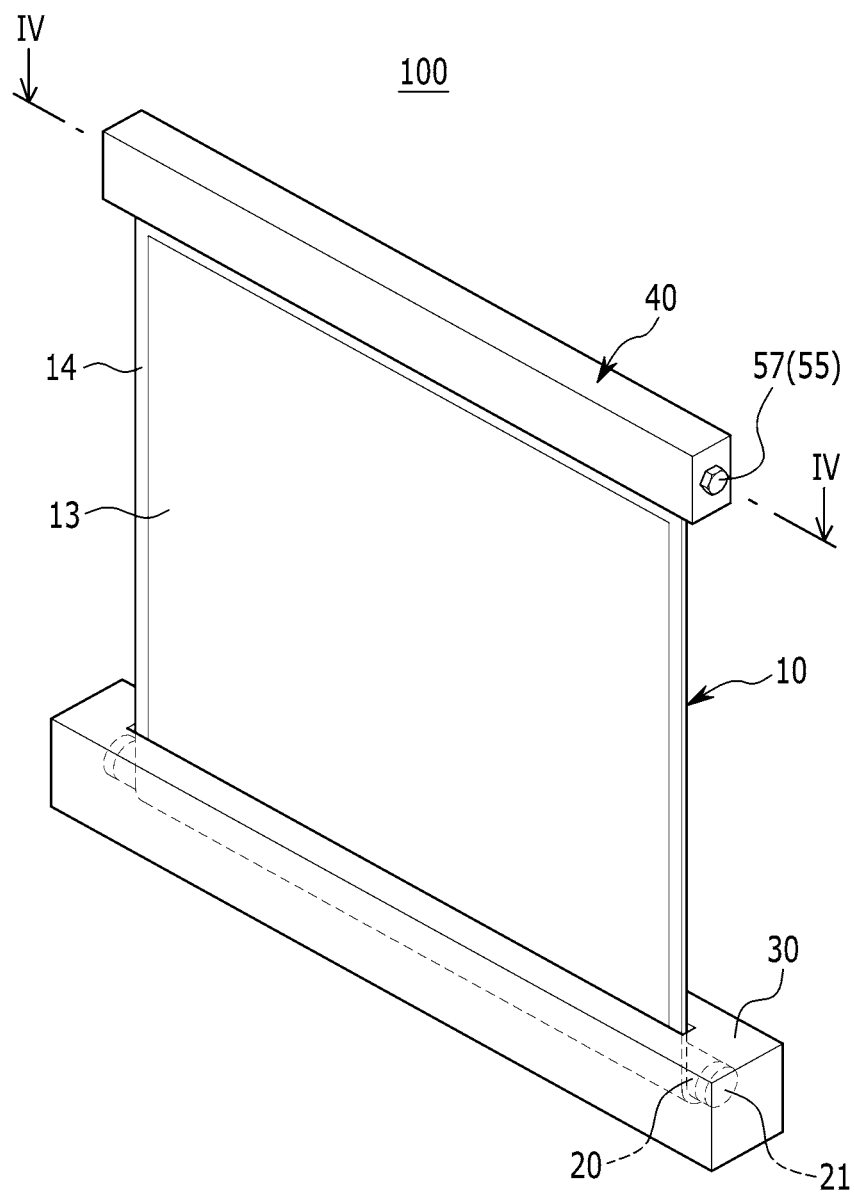
FIG. 1 is a perspective view illustrating a display device according to an embodiment.
Figure 2:
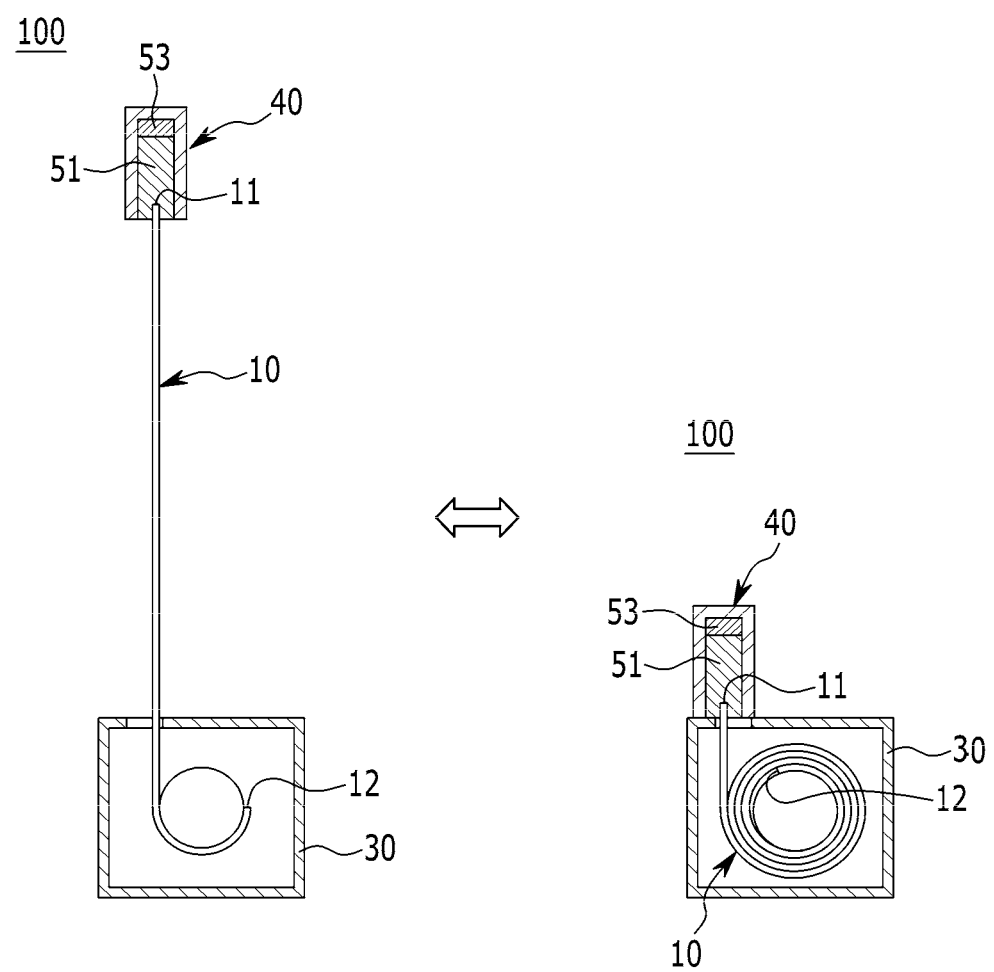
FIG. 2 is a cross-sectional view illustrating modes of the display device illustrated in FIG. 1 according to an embodiment.
Figure 3:
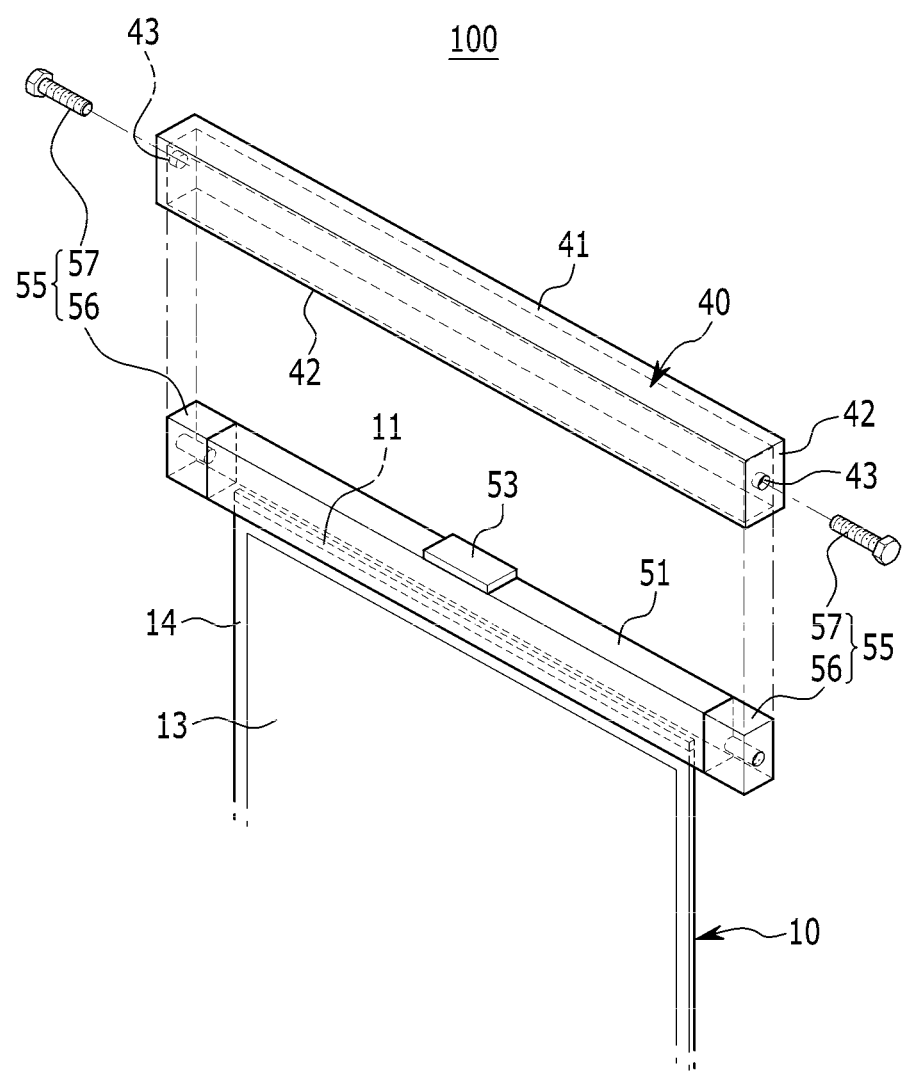
FIG. 3 is a partial exploded perspective view illustrating the display device illustrated in FIG. 1 according to an embodiment.
Figure 4A:
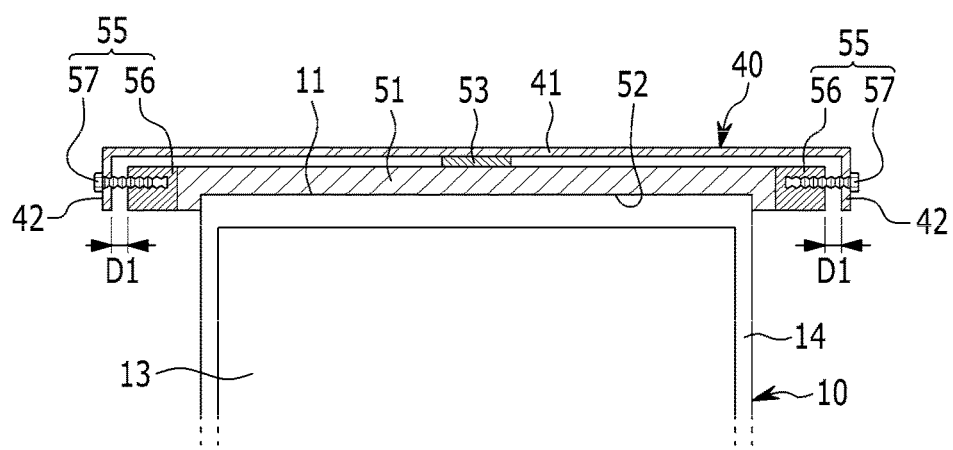
FIG. 4A and FIG. 4B are partial cross-sectional views illustrating the display device taken along a line IV-IV of FIG. 1 according to an embodiment.
Figure 4B:
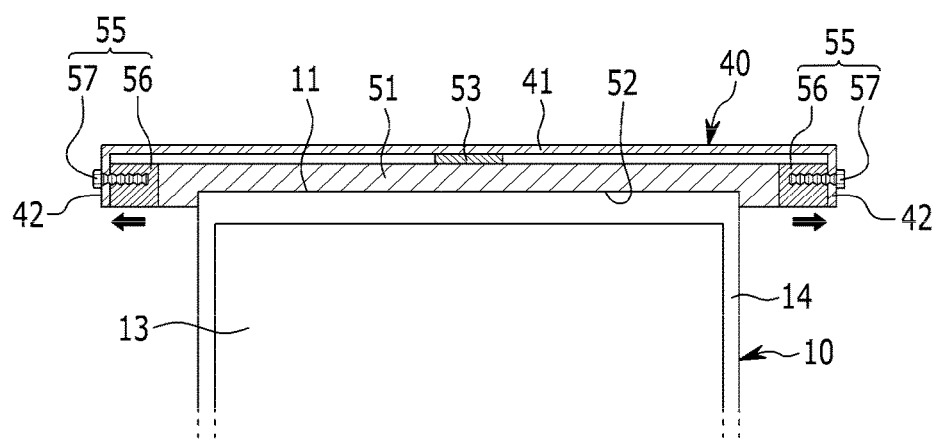

FIG. 1 is a perspective view illustrating a display device according to an embodiment. FIG. 2 is a cross-sectional view illustrating the display device illustrated in FIG. 1 according to an embodiment. FIG. 3 is a partial exploded perspective view illustrating the display device illustrated in FIG. 1 according to an embodiment. FIG. 4A and FIG. 4B are partial cross-sectional views taken along a line IV-IV of FIG. 1 according to an embodiment.

Referring to FIG. 1 and FIG. 2, the display device 100 includes a flexible display panel 10 (hereinafter, referred to as 'display panel' for convenience) for displaying images, a roller 20 disposed to wind the display panel 10, a housing 30 for accommodating the roller 20, and a fixing frame 40 coupled to an edge of the display panel 10.

The display panel 10 may include a plurality of pixels positioned on a flexible plastic film. The display panel 10 can be easily bent.

The display panel 10 may be/include an organic light emitting diode display panel which does not require a backlight. The organic light emitting diode display panel may include a flexible substrate, a plurality of thin film transistors and a plurality of organic light emitting diodes formed on the flexible substrate, and an encapsulation layer disposed to cover and encapsulate the plurality of organic light emitting diodes.

In an embodiment, the display panel 10 may have a substantially rectangular shape having two pairs of linear edges. A first edge of the display panel 10 is coupled to the fixing frame 40, and a second edge of the display panel 10 opposite to the first edge is fixed to the roller 20. For convenience of description, the first edge coupled to the fixing frame 40 is referred to as a first edge 11, and the second edge fixed to the roller 20 and opposite to the first edge is referred to as a second edge 12.

The display panel 10 includes a display portion 13 in which a plurality of pixels are formed to actually display images, and a non-display portion (or dummy portion) 14 surrounding the display portion 13. The first edge 11 and the second edge 12 of the display panel 10 are separated from the display portion 13 by a distance.

At least part of the edge of the non-display portion 14 may be significantly narrower than the display portion 13, may be inconspicuous to naked eyes, or may be unnecessary. In an embodiment, the non-display portion 14 may include an extremely narrow region that may extend perpendicular to the fixing frame 40 or the roller 20 or may include no portion that extends perpendicular to an extension direction of the roller 20.

The roller 20 is disposed in the housing 30 and may be rotated in a forward or reverse direction by a motor 21. In a standby mode, the display panel 10 is wound on the roller 20 and accommodated in the housing 30. In a use/display mode, the display panel 10 is released and unrolled from the roller 20. For the display panel 10 to be wound on and released from the roller 20, rotational directions of the roller 20 are opposite to each other.

The display panel 10 may have an additional mechanism (not illustrated) for automatically unfolding the roller 20 and supporting the unfolded display panel 10 to maintain an unfolded state. For example, a mechanism is mounted between the housing 30 and the fixing frame 40 to upwardly move the fixing frame 40 and constantly maintain a distance between the housing 30 and the fixing frame 40 when the fixing frame 40 is upwardly moved to a maximum height.

Referring to FIG. 3 to FIG. 4B, the first edge 11 of the display panel 10 is coupled to the fixing frame 40 through an elastic holder 51 and a tension applier 55 without being directly coupled to the fixing frame 40. The elastic holder 51 and the tension applier 55 may prevent or minimize generation of wrinkles of the display panel 10.

The first edge 11 of the display panel 10 is coupled to the elastic holder 51. The elastic holder 51 may be a substantially bar-like member having a long side parallel to the first edge 11. In embodiments, a length of the long side may be equal to or greater than of the first edge 11.

In FIG. 3 to FIG. 4B, an example in which the length of the elastic holder 51 is greater than that of the first edge 11 of the display panel 10 is illustrated. The elastic holder 51 may be formed of, e.g., synthetic rubber.

A groove 52 may be formed at a side of the elastic holder 51 facing the display panel 10, and a portion of the non-display portion 14 adjacent to the first edge 11 may be fit into the groove 52. The portion of the non-display portion 14 fit into the groove portion 52 may be fixed to the elastic holder 51 by a fixing means such as an adhesive. The adhesive may be applied to both a front surface and a rear surface of the portion of the non-display portion 14.

The tension applier set 55 (or tension applier 55 for conciseness) is disposed at opposite end portions of the elastic holder 51 (respectively adjacent to opposite side walls 42 of the frame 40) to tension the elastic holder 51. For example, the tension applier 55 may include a pair of nuts 56 fixed to the opposite end portions of the elastic holder 51 and a pair of bolts 57 fastened to the respective nuts 56. The bolts 57 may respectively extend through openings 43 of the two side walls 42, and the side walls 42 (or the whole fixing frame 40) may be interposed between heads of the bolts 57. The bolts 57 may be aligned with each other. A longitudinal direction of each of the bolts 57 is parallel to the first edge 11.

Positions (e.g., translational positions) of the bolts 57 are fixed by the side wall 42 of the fixing frame 40. Accordingly, when the bolts 57 are rotated, the nuts 56 are moved. As a result, positions of the nuts 56 may be determined depending on the rotational direction and rotational amounts of the bolts 57, and a tension degree of the elastic holder 51 may be controlled by adjusting a distance between the nuts 56. As a result, the greater the distance between the pair of nuts 56, the stronger the elastic holder 51 can be tensioned.

FIG. 4A illustrates a state before the elastic holder 51 is tensioned, and FIG. 4B illustrates a state after the elastic holder 51 is tensioned by movement of the nuts 56. FIG. 4A illustrates that each of the nuts 56 maintains a distance D1 from the corresponding side wall 42 of the fixing frame 40, but FIG. 4B illustrates that the nuts 56 contact the side wall 42 of the fixing frame 40.

The fixing frame 40 may include a cover surface 41 (or cover 41) and four side walls 42 connected to edges of the cover surface 41. The four side walls 42 surround and substantially conceal the elastic holder 51 and the nuts 56. Circular openings 43 may be formed in two of the four side walls 42, and the bolts 57 may respectively extend through the openings 43.

The elastic holder 51 receives a force for extending in a longitudinal direction by the tension applier 55. if the elastic holder 51 is entirely fixed to the cover surface 41 of the fixing frame 40, the elastic holder 51 is not smoothly tensioned. In an embodiment, the entire part of the elastic holder 51 may be separated from the cover surface 41 of the fixing frame 40.

In an embodiment, the elastic holder 51 may be partially fixed to the cover surface 41 of the fixing frame 40 by a fixing portion 53 (or connector 53) in a range having no significant influence on the tension. The fixing portion 53 may fix a central portion of the elastic holder 51 to the cover surface 41 of the fixing frame 40. A position of the fixing portion 53 is not limited to the central portion of the elastic holder 51.

The tension applier 55 is not limited to the aforementioned bolt-nut assembly. The tension applier 55 may be/include an alternative or additional mechanism for tensioning the elastic holder 51.

The display device 100 tensions the first edge 11 of the display panel 10 using the elastic holder 51 and the tension applier 55, and improves flatness of the display panel 10. Accordingly, it is possible to prevent or minimize generation of wrinkles of the display panel 10 around the first edge 11, and it is possible to prevent image distortion potentially caused by wrinkles and/or to prevent damage to the display panel 10.

Figure 5:
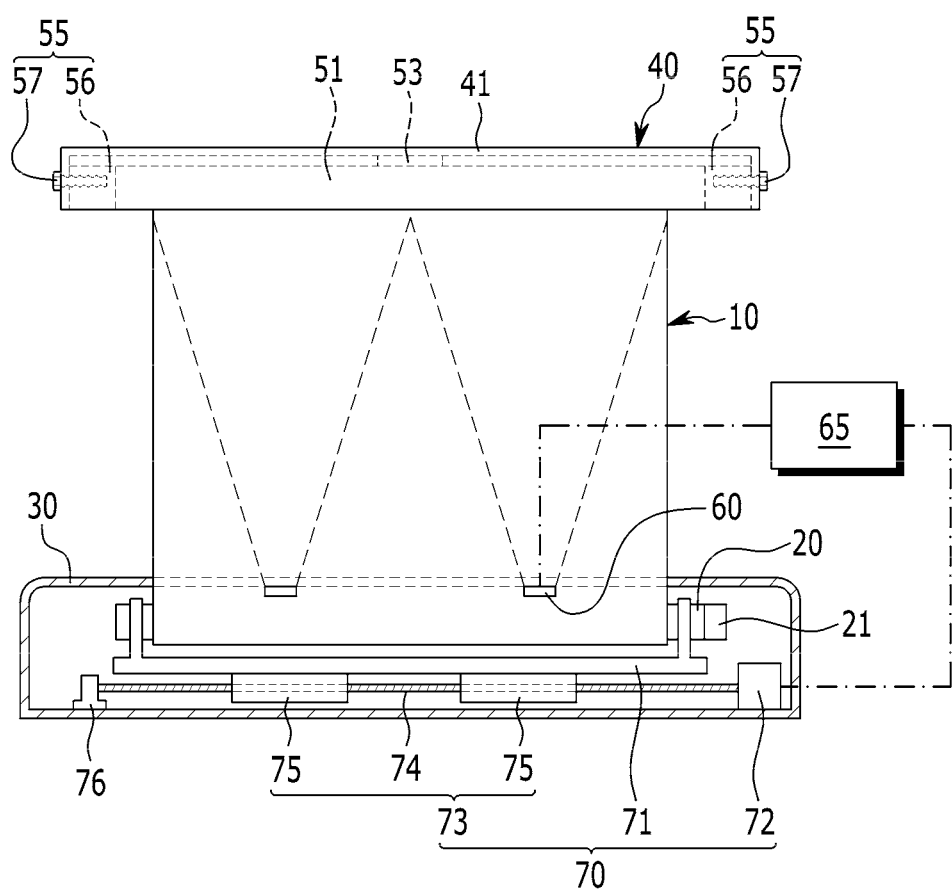
FIG. 5 is a front view illustrating a display device according to an embodiment.

FIG. 5 is a front view illustrating a display device according to an embodiment.

Referring to FIG. 5, the display device 200 includes an optical sensor 60 for sensing wrinkles of the display panel 10, and a roller moving unit 70 for moving the roller 20 in an axial direction parallel to the rotation axis of the roller (a left or right side based on the drawing).

The optical sensor 60 is mounted at an upper end of the housing 30 to observe wrinkles of the display panel 10 by photographing a front surface or a rear surface of the display panel 10. The optical sensor 60 may be/include a commercially available camera or image sensor. A detection signal of the optical sensor 60 may be transferred to a controller 65, and the controller 65 may automatically control the roller moving unit 70 in response to the detection signal.

The roller moving unit 70 includes a roller supporting unit 71 for supporting the roller 20, a moving motor 72 for generating power to move the roller supporting unit 71, and a power transmission unit 73 for connecting the roller supporting unit 71 with the moving motor 72. The roller supporting unit 71 is coupled to the roller 20 by a bearing (not illustrated) to enable rotation of the roller 20 and support the roller 20 at a bottom portion of the roller 20.

The power transmission unit 73 may include a rotary screw 74 fixed to the moving motor 72, and a nut block 75 fixed to the roller supporting unit 71 and screw-coupled to the rotary screw 74. A first end of the rotary screw 74 is fixed to the moving motor 72, and a second end of the rotary screw 74 is coupled to a bearing 76. The nut block 75 may include a pair of nut blocks, and the pair of nut blocks 75 may be screw-coupled to the rotary screw 74.

When the moving motor 72 rotates in a forward direction, the rotary screw 74 also rotates in the forward direction, and the nut block 75 and the supporting unit 71 move in a first direction to move the entire roller 20 in the first direction. Conversely, when the moving motor 72 rotates in an opposite direction, the rotary screw 74 also rotates in the opposite direction, and the nut block 75 and the roller supporting unit 71 move in a second direction to move the entire roller 20 in the second direction.

A moving direction and a moving amount of the roller 20 can be precisely controlled depending on a rotating direction and a rotating amount of the moving motor 72. The power transmission unit 73 is not limited to the aforementioned configuration, and may be/include one or more alternative or additional mechanisms such as an LM (linear motor) guide including an LM rail and an LM block.

When the mode is changed from the use mode to the standby mode, the display panel 10 is wound on the rotating roller 20, and is accommodated in the housing 30. If misalignment is generated between the roller 20 and the display panel 10 in an operation in which the display panel 10 is wound on the roller 20 and if the misalignment is not corrected, wrinkles may be generated on the display panel 10.

Referring to FIG. 5, if the optical sensor 60 senses that the display panel 10 is left-biasedly wound, the controller 65 rotates the moving motor 72 in a forward or reverse direction and rotates the roller supporting unit 71 in a left direction to move the entire roller 20 in the left direction.

If the optical sensor 60 senses that the display panel 10 is right-biasedly wound, the controller 65 rotates the moving motor 72 in the reverse or forward direction and rotates the roller supporting unit 71 in a right direction to move the entire roller 20 in the right direction.

In an embodiment, the controller 65 compensates a bias of the display panel 10 by moving the roller 20 in a direction in which the display panel 10 is biased, to prevent or minimize wrinkle generation potentially caused by the bias. As a result, the display panel 10 can be wound on a predetermined position of the roller 20, e.g., a center of the roller 20, without generating wrinkles.

The roller moving unit 70 may compensate a bias of the display panel 10 when the display panel 10 is wound, and may precisely control a position of the display panel 10 when the display panel 10 is unfolded.

One or more of the characteristics of the display device described with reference to FIG. 1 to FIG. 4B may be applicable to the display device 200.

Figure 6:
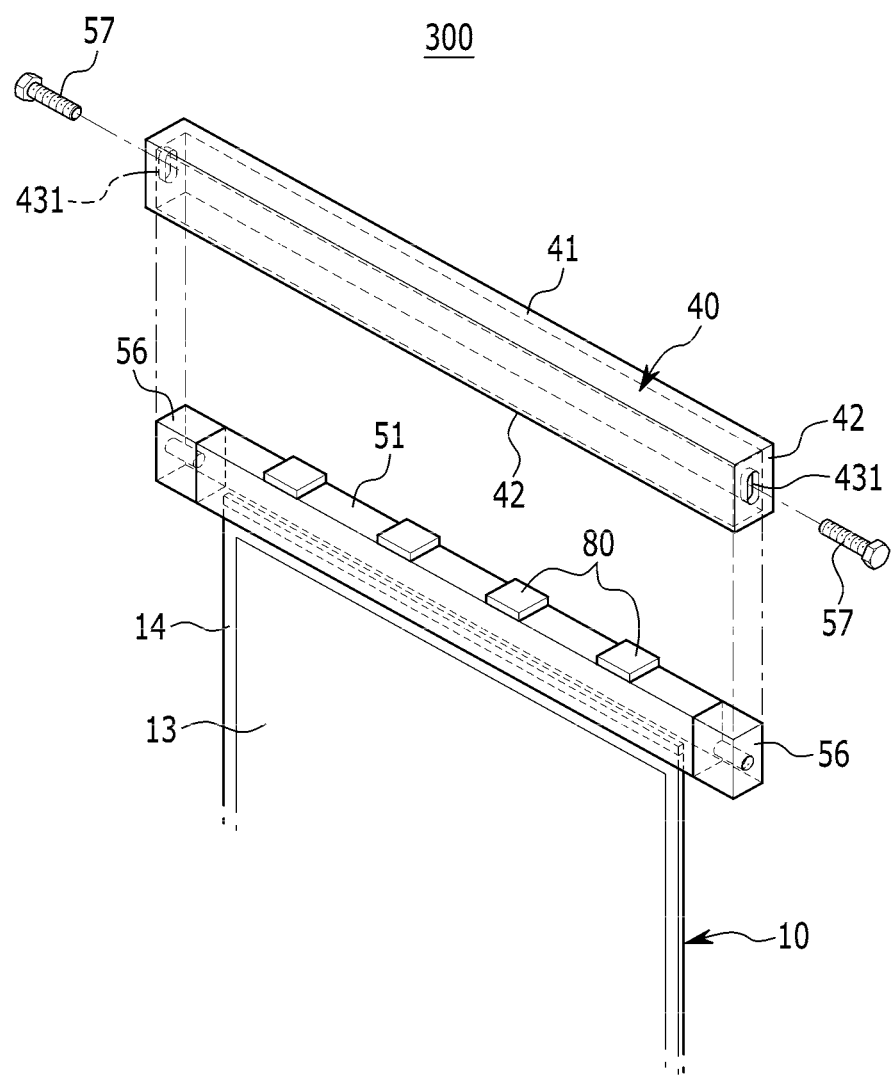
FIG. 6 is a partial exploded perspective view illustrating a display device according to an embodiment.
Figure 7A:
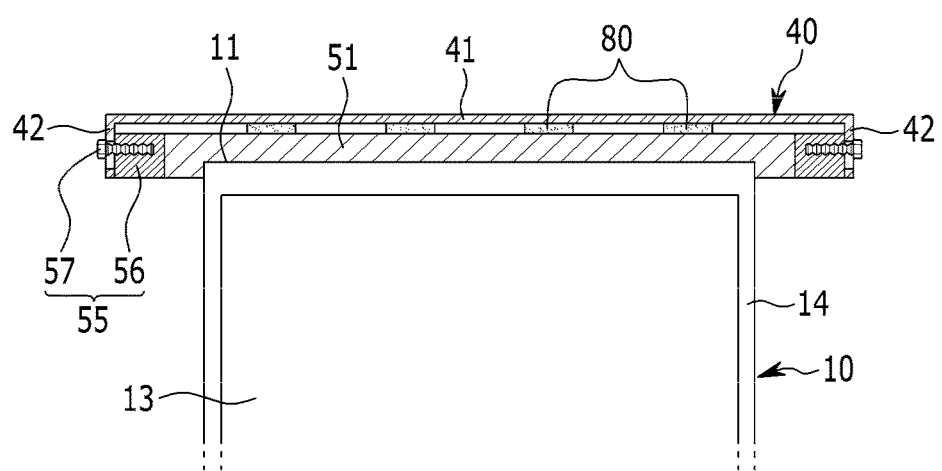
FIG. 7A and FIG. 7B are partial cross-sectional views illustrating the display device according to an embodiment.
Figure 7B:
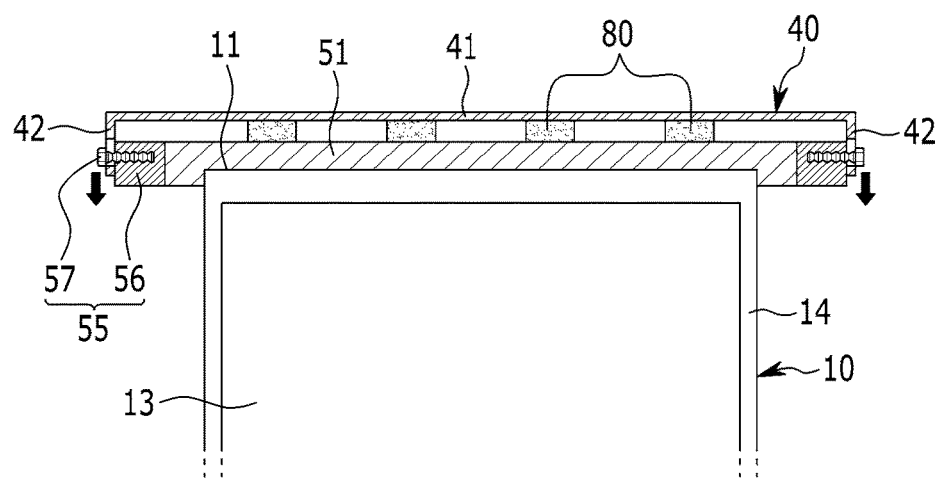

FIG. 6 is a partial exploded perspective view illustrating a display device according to an embodiment, and FIG. 7A and FIG. 7B are partial cross-sectional views illustrating the display device according to an embodiment.

Referring to FIG. 6 to FIG. 7B, the display device 300 includes a plurality of dampers 80 mounted between the fixing frame 40 and the elastic holder 51.

The dampers 80 may be formed of a material (e.g., a synthetic rubber) having elasticity that is greater than that of the elastic holder 51 and may be spaced from one another. The dampers 80 may be/include one or more springs.

When the display panel 10 is wound on the roller 20 by rotation of the roller 20, the display panel 10 receives a force for pulling downward. When the display panel 10 receives the force for pulling downward, the dampers 80 are tensioned in a direction in which the display panel 10 is pulled (i.e., stretch toward the display panel 10) to disperse the force that has concentrate on the display panel 10 and to balance the tension that the display panel 10 receives.

FIG. 7A illustrates a state before the dampers 80 are tensioned, and FIG. 7B illustrates a state after the dampers 80 are tensioned.

In an embodiment, the elastic holder 51 and the tension applier 55 are slidably coupled to the fixing frame 40 in order to tension/stretch the dampers 80. In an embodiment, as illustrated in FIG. 6, openings 431 through which the bolts 57 extend may be long slits extending in the direction in which the display panel 10 is pulled.

In an embodiment, when the display panel 10 receives the force pulling downward, the bolts 57 slide downwardly along the opening 431 to downwardly move the elastic holder 51 and to vertically move the dampers 80, and sliding movement of the elastic holder 51 may be guided by one or more side walls of the frame 40 directly contacting the elastic holder 51 and illustrated in FIG. 2.

One or more of the characteristics of the display device described with reference to FIG. 1 to FIG. 4B and the display device described with reference to FIG. 5 may be applicable to the display device 300.

According to embodiments, a display device may display images with satisfactory quality by making the display panel 10 sufficiently flat. According to embodiments, it is possible to prevent or minimize wrinkles when the display panel 10 is wound. In embodiments, it is possible to provide satisfactory reliability of display devices by preventing or minimizing damage of the display panel 10 potentially caused by wrinkles.

While example embodiments have been described, practical embodiments are not limited to the described embodiments. Embodiments are intended to cover various modifications and equivalent arrangements within the spirit and scope defined by the appended claims.

What is claimed is:

1. A display device comprising:
a flexible display panel;
a roller configured to wind the flexible display panel;
an elastic holder fixed to an edge of the flexible display panel, wherein a side of the elastic holder is parallel to the edge of the flexible display panel; and
a first tension applier and a second tension applier only disposed at a first end of the elastic holder and a second end of the elastic holder, respectively, and configured to tension the elastic holder in a lengthwise direction of the elastic holder,
wherein the elastic holder is formed of an elastic material that is not metal.

2. The display device of claim 1,
wherein the side of the elastic holder is as long as or longer than the edge of the flexible display panel,
wherein the elastic holder has a groove, and
wherein the edge of the flexible display panel is secured in the groove.

3. The display device of claim 1 comprising:
a damper, wherein elasticity of the damper is greater than elasticity of the elastic holder, and wherein the elastic holder is positioned between the damper and the flexible display panel; and
a frame connected through the damper to the elastic holder.

4. The display device of claim 3, wherein the frame comprises:
a cover, wherein the damper is positioned between the cover and the elastic holder; and
a wall directly connected to the cover, directly contacting the elastic holder, and configured to guide sliding movement of the elastic holder when the damper stretches toward the flexible display panel.

5. A display device comprising:
a flexible display panel;
a roller configured to wind the flexible display panel;
an elastic holder fixed to an edge of the flexible display panel, wherein a side of the elastic holder is parallel to the edge of the flexible display panel;
a first tension applier and a second tension applier disposed at a first end of the elastic holder and a second end of the elastic holder, respectively, and configured to tension the elastic holder; and
a frame at least partially surrounding the elastic holder,
wherein the frame comprises a cover and a first side wall, and
wherein the first side wall is directly connected to the cover and is oriented at a right angle, an acute angle, or an obtuse angle with respect to the cover.

6. The display device of claim 5, wherein the first tension applier comprises:
a first nut fixed to the first end of the elastic holder; and
a first bolt extending through the first side wall and partially positioned inside the first nut.

7. The display device of claim 6, further comprising:
a housing at least partially surrounding the roller;
an optical sensor mounted in the housing and configured to sense at least one of biased rolling and wrinkles of the flexible display panel by photographing the flexible display panel; and
a roller moving unit coupled to the roller and configured to move the roller in a direction parallel to an axis of the roller.

8. The display device of claim 7, wherein the roller moving unit is longer than the roller in the direction.

9. The display device of claim 7, wherein the roller moving unit comprises:
a roller supporting unit coupled to the roller;
a power transmission unit; and
a moving motor coupled to the roller supporting unit through the power transmission unit and configured to provide power for moving the roller supporting unit.

10. The display device of claim 9, wherein the power transmission unit comprises:

a rotary screw fixed to the moving motor; and
a nut block fixed to the roller supporting unit and screw-coupled to the rotary screw.

11. The display device of claim 5, further comprising:
a connector shorter than the side of the elastic holder, positioned between the elastic holder and the cover, and fixing the elastic holder to the cover.

12. The display device of claim 5, further comprising:
a plurality of elastic dampers disposed between the elastic holder and the cover and connected to each of the elastic holder and the cover.

13. The display device of claim 12, wherein elasticity of the elastic dampers is greater than elasticity of the elastic holder.

14. The display device of claim 12, wherein the elastic dampers are configured to extend toward the flexible display panel when the flexible display panel is wound on the roller.

15. The display device of claim 14, wherein the first tension applier is configured to slide further away from the cover when the flexible display panel is wound on the roller.

16. The display device of claim 15, wherein the first side wall has a first slit, wherein the first tension applier comprises:
a first nut fixed to the first end of the elastic holder; and
a first bolt extending through the first slit, fastened to the first nut, and is configured to slide along the first slit.

17. A display device comprising:
a flexible display panel;
a roller configured to wind the flexible display panel;
an elastic holder fixed to an edge of the flexible display panel, wherein a side of the elastic holder is parallel to the edge of the flexible display panel; and
a first tension applier and a second tension applier disposed at a first end of the elastic holder and a second end of the elastic holder, respectively, and configured to tension the elastic holder, wherein the first tension applier comprises
a first nut secured to the first end of the elastic holder
and a first bolt partially positioned inside the first nut.

18. The display device of claim 17, wherein the first nut is as wide as the first end of the elastic holder in a direction perpendicular to the side of the elastic holder.

19. The display device of claim 17, wherein the second tension applier comprises:
a second nut secured to the second end of the elastic holder; and
a second bolt partially positioned inside the second nut and aligned with the first bolt.

20. The display device of claim 19 comprising:
a frame comprising two side walls opposite each other,
wherein the elastic holder is positioned between the two side walls,
wherein the first bolt comprises a first bolt head,
wherein the second bolt comprises a second bolt head, and
wherein the two side walls are positioned between the first bolt head and the second bolt head.

* * * * *